(12) United States Patent
Kumar et al.

(10) Patent No.: US 11,610,612 B2
(45) Date of Patent: Mar. 21, 2023

(54) HIGH SPEED SRAM USING ENHANCE WORDLINE/GLOBAL BUFFER DRIVE

(71) Applicant: STMicroelectronics International N.V., Geneva (CH)

(72) Inventors: Ashish Kumar, Jharkhand (IN); Dipti Arya, Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/375,149

(22) Filed: Jul. 14, 2021

(65) Prior Publication Data

US 2022/0020405 A1    Jan. 20, 2022

Related U.S. Application Data

(60) Provisional application No. 63/053,876, filed on Jul. 20, 2020.

(51) Int. Cl.
*G11C 7/10* (2006.01)
*G11C 7/22* (2006.01)
*G11C 5/14* (2006.01)
*G11C 8/08* (2006.01)

(52) U.S. Cl.
CPC .............. *G11C 7/1039* (2013.01); *G11C 5/14* (2013.01); *G11C 7/1063* (2013.01); *G11C 7/222* (2013.01); *G11C 8/08* (2013.01)

(58) Field of Classification Search
CPC ....... G11C 7/1039; G11C 5/14; G11C 7/1063; G11C 7/222; G11C 8/08; G11C 7/14; G11C 8/10

USPC ..................................................... 365/189.05
See application file for complete search history.

(56) References Cited

U.S. PATENT DOCUMENTS

| | | | |
|---|---|---|---|
| 6,628,564 B1* | 9/2003 | Takita ................. | G11C 11/4074 365/189.11 |
| 10,249,361 B2 | 4/2019 | Wang et al. | |
| 10,262,707 B2 | 4/2019 | Nii et al. | |
| 2010/0302880 A1 | 12/2010 | Wang et al. | |
| 2012/0092041 A1* | 4/2012 | Wang ....................... | G11C 8/10 326/108 |
| 2014/0016400 A1* | 1/2014 | Pelley .................. | G11C 11/418 365/154 |

(Continued)

FOREIGN PATENT DOCUMENTS

CN              104575580 B  *   6/2017   ........... G11C 11/418

*Primary Examiner* — Fernando Hidalgo
(74) *Attorney, Agent, or Firm* — Crowe & Dunlevy

(57) ABSTRACT

A row decoder includes decoder logic generating an initial word line signal, and two inverters. The first inverter is formed by a first p-channel transistor having a source coupled to a supply voltage and a gate receiving the initial word line signal. The second inverter is formed by a first n-channel transistor having a drain coupled to a drain of the first p-channel transistor, a source coupled to a shared ground line, and a gate receiving the initial word line signal. An inverse word line signal is generated at the drain of the first n-channel transistor. A second inverter inverts the inverse word line signal to produce a word line signal. Negative bias generation circuitry generates a negative bias voltage on the shared ground line when the initial word line signal is logic high, and otherwise couples the shared ground line to ground.

21 Claims, 3 Drawing Sheets

(56) References Cited

U.S. PATENT DOCUMENTS

2015/0295492 A1* 10/2015 Li ............................ H02M 3/07
                                                              327/536
2017/0098474 A1* 4/2017 Tran ...................... H01L 27/112
2020/0035288 A1    1/2020 Taghvaei et al.

* cited by examiner

HIGH SPEED SRAM USING ENHANCE WORDLINE/GLOBAL BUFFER DRIVE

RELATED APPLICATION

This application claims priority to United States Provisional Application for Patent Nos. 63/053,876, filed Jul. 20, 2020, the disclosure of which is incorporated by reference.

TECHNICAL FIELD

This disclosure is directed to the field of static random access memory (SRAM) and, in particular, to a high speed SRAM architecture utilizing enhanced word line drivers to facilitate high speed operation without an excess increase in area and without an excess increase in leakage current.

BACKGROUND

Static random access memory (SRAM) is used in many electronic devices in the modern world. Read and write speed of a SRAM is of paramount importance in many applications since a SRAM that cannot keep up with data requests and data writes initiated by a microprocessor or a system on a chip will degrade performance of the electronic device into which it is integrated. In mobile device applications (smartphones, tablets, laptops, smartwatches, and other wearables), providing sufficient speed while maintaining low power consumption is also of importance, because such mobile devices are powered by rechargeable batteries and is desired for those batteries to last as long as possible between recharges. Still further, in such mobile device applications, it is desired for the SRAM, as well as other electronic components, to be as compact as possible so as to make room for as large a rechargeable battery as possible for a given portable housing size.

Reference is now made to FIG. 1 which shows a simplified block diagram of a memory circuit 10. The circuit 10 includes an array 12 of memory cells C arranged in rows and columns. The memory cells in each row are controlled by a word line from among word lines 14a, . . . , 14m. The memory cells in each column are connected to a bit line from among bit lines 16a, . . . , 16n. A row decoder circuit 18 receives a row address that is predecoded from an address 20 and decodes the bits of the row address to select and actuate one of the word lines 14a, . . . , 14m. A column decoder circuit 22 receives a column address that is predecoded from the address 20 and decodes the bits of the column address to select a plurality of the bit lines 16a, . . . , 16n. In write mode, data on the data input/output lines 24 is written to the memory cells which are located at the intersections of the selected one of the word lines 14a, . . . , 14m and the plurality of bit lines 16a, . . . , 16n selected by the address 20. In read mode, data stored in the memory cells which are located at the intersections of the selected one of the word lines 14a, . . . , 14m and the plurality of bit lines 16a, . . . , 16n selected by the address 20 is read out to the data input/output lines 24.

A successful read or write operation is contingent on application of the actuation voltage (typically a logic high voltage Vdd) by the word line driver circuit at the selected one of the word lines 14a, . . . , 14m to each memory cell C in the selected row.

By altering the word line driver circuit, the speed of the SRAM can be increased. For example, a word line driver circuit utilizing low threshold voltage (LVT) MOS transistors provides for greater read/write speed without a penalty in terms of area, but increases leakage currents, causing increased power consumption. In addition, a word line driver circuit utilizing low threshold MOS transistors may simply not be usable with certain technologies.

As another example, the size of the transistors inside a word line driver can be increased, which does provide for greater read/write speed, but consumes excess area, and increases leakage currents, causing increased power consumption. As yet another example, the transistors inside a word line driver can be operated with a forward body bias, which does provide for greater read/write speed, but increases leakage currents, causing increased power consumption. Moreover, in some applications, it may not feasible to add a separate supply voltage to provide the forward body bias.

As a final example, "repeaters" can be used in the word line, meaning that buffers can be inserted between certain memory cells. While this does provide for greater read/write speed, it consumes excess area.

As such, it is evident that further development into SRAM technology is needed so as to provide for greater read/write speed, but without the above described drawbacks in terms of excess leakage currents, excess area consumption, and inability to be used with certain technologies.

SUMMARY

Disclosed herein is decoder circuitry for a memory. The decoder circuitry includes a row decoder, which is formed by decoder logic configured to generate an initial word line signal, and first and second inverters. The first inverter includes a first p-channel transistor having a source coupled to a supply voltage, a drain, and a gate coupled to the decoder logic to receive the initial word line signal, and a first n-channel transistor having a drain coupled to the drain of the first p-channel transistor, a source coupled to a shared ground line, and a gate coupled to the decoder logic to receive the initial word line signal. An inverse word line signal is generated at the drains of the first p-channel transistor and the first n-channel transistor. The second inverter is configured to invert the inverse word line signal to produce a word line signal. Negative bias generation circuitry is configured to generate a negative bias voltage on the shared ground line when the initial word line signal is at a logic high, and to couple the shared ground line to ground when the initial word line signal is at a logic low.

The negative bias generation circuitry may include an n-channel transistor having a drain coupled to the shared ground line, a source coupled to ground, and a gate biased by a negative bump enable signal, and a first capacitor having a first terminal coupled to the drain of the n-channel transistor and a second terminal coupled to a first delayed negative bump enable signal, the first delayed negative bump enable signal being a delayed version of the negative bump enable signal.

The negative bias generation circuitry may also include a second capacitor having a first terminal coupled to the drain of the n-channel transistor and a second terminal coupled to a second delayed negative bump enable signal.

The second delayed negative bump enable signal may also be generated by performing a logical NAND operation on an inverse of the negative bump enable signal and a low speed latch.

The negative bump enable signal may be generated by delaying an inverse of a global clock signal, and performing a logical NAND operation between the delayed inverse global clock signal and the inverse global clock signal.

The row decoder and negative bias generation circuitry may be formed in fully depleted silicon on insulator technology.

Also disclosed herein is a method of operating a row decoder for a memory, the row decoder including decoder logic that generates an initial word line signal, and a first inverter powered between a supply voltage and a shared ground line, the first inverter having an input coupled to the decoder logic to receive an initial word line signal and having an output generating an inverse word line signal. The method includes generating a negative bias voltage on the shared ground line when the initial word line signal is at a logic high, and coupling the shared ground line to ground when the initial word line signal is at a logic low. Also disclosed herein is a memory unit, including a memory array coupled to a word line signal and a row decoder for the memory array. The row decoder includes a first inverter powered between a supply voltage and a shared ground line, the first inverter having an input configured to receive an initial word line signal and having an output generating an inverse word line signal. The row decoder also includes a second inverter powered between the supply voltage and ground, the second inverter having an input configured to receive the inverse word line signal and having an output generating the word line signal. The shared ground line is configured to receive a negative bias voltage when the initial word line signal is at a first logic level, and to receive a ground voltage when the initial word line signal is at a second logic level different than the first logic.

Negative bias generation circuitry may be configured to generate the negative bias voltage on the shared ground line when the initial word line signal is at the first logic level, and to couple the shared ground line to ground when the initial word line signal is at the second logic level.

The negative bias generation circuitry may include a first transistor having a first conduction terminal coupled to the shared ground line, a second conduction terminal coupled to ground, and a gate biased by a negative bump enable signal. The negative bias generation circuitry may also include a first capacitor having a first terminal coupled to the first conduction terminal of the first transistor and a second terminal coupled to a first delayed negative bump enable signal, the first delayed negative bump enable signal being a delayed version of the negative bump enable signal. The negative bias generation circuitry may further include a second capacitor having a first terminal coupled to the first conduction terminal of the first transistor and a second terminal coupled to a second delayed negative bump enable signal.

The negative bump enable signal may be generated by delaying an inverse of a global clock signal, and performing a logical NAND operation between the delayed inverse global clock signal and the inverse global clock signal.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
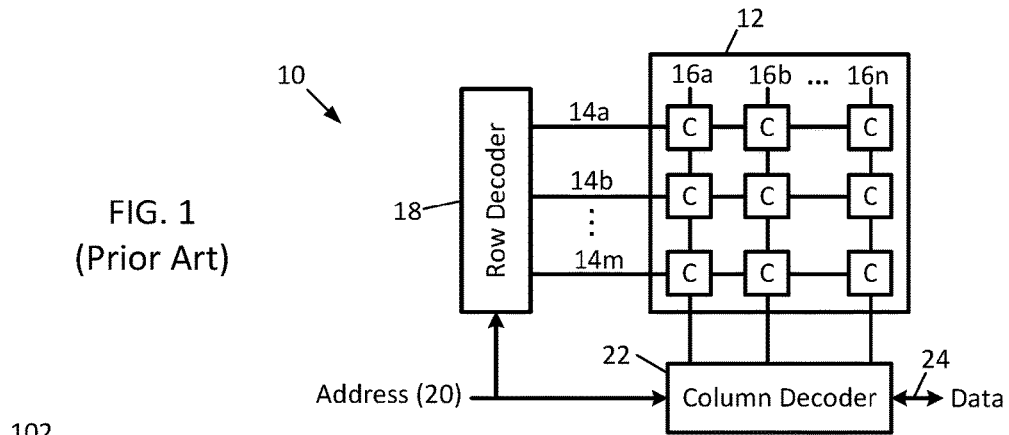
FIG. 1 is a block diagram of a prior art memory architecture.
Figure 2:
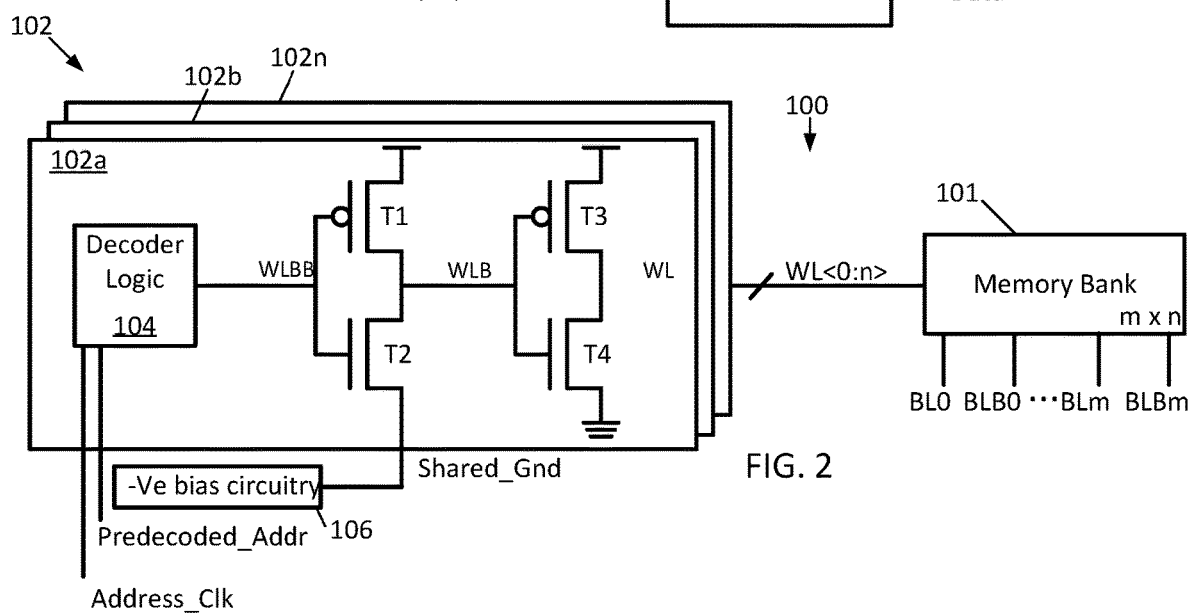
FIG. 2 is a schematic block diagram of a memory architecture disclosed herein that utilizes a negative voltage as a shared ground for elements of the word line driver to increase the speed of the SRAM within the memory architecture.

Now described with reference to FIG. 2 is a SRAM architecture 100 comprised of an m-by-n SRAM memory 101 (having m columns and n rows), row decoders 102a, . . . , 102n, column decoders (not shown), and a pre-decoder (not shown). Note that the number of row decoders 102 and the number of rows in the SRAM 101 are equal, and that each row decoder is paired to one row of the SRAM 101.

The row decoder 102a will now be described, but it will be understood that the remainder of the row decoders 102b, . . . , 102n have the same structure. The pre-decoder receives an address, pre-decodes the address, and sends the pre-decoded address Predecoded_Addr to decoder logic 104 within the row decoder 102a. From the pre-decoded address Predecoded_Addr, the decoder logic 104 generates a word line signal WLBB. A CMOS inverter formed by p-channel transistor T1 and n-channel transistor T2 receives the word line signal WLBB at its input, and outputs an inverse word line signal WLB. A CMOS inverter formed by p-channel transistor T3 and n-channel transistor T4 receives the inverse word line signal WLB at its input, and outputs a word line signal WL for the row of the SRAM 101 corresponding to decoder 102a.

As to the structure of the inverters, the inverter formed by transistors T3 and T4 is formed by the p-channel transistor T3 having its source connected to a supply voltage, its drain connected to a drain of the n-channel transistor T4, and its gate connected to both the gate of n-channel transistor T4 and the drains of transistors T1 and T2. The n-channel transistor T4 has its drain connected to the drain of the p-channel transistor T3, its source connected to ground, and its gate connected to both the gate of the p-channel transistor T3 and the drains of transistors T1 and T2.

The inverter formed by transistors T1 and T2 is formed by the p-channel transistor T1 having its source connected to a supply voltage, its drain connected to a drain of the n-channel transistor T2, and its gate connected to the gate of the n-channel transistor T2 as well as to the output of the decoder logic 104. The n-channel transistor T2 has its drain connected to the drain of the p-channel transistor T1, has its gate connected to the gate of the p-channel transistor T1 as well as to the output of the decoder logic 104, and has its source connected to a shared ground node Shared_Gnd. Negative bias circuitry 106 is coupled to the shared ground node Shared_Gnd, and sets the voltage at the shared ground node Shared_Gnd to be equal to −Ve (a negative voltage)

when the row decoder 102a is activated. The negative bias circuitry 106 is common to all row decoders 102, and is therefore not replicated multiple times like the row decoders 102.

Figure 7:
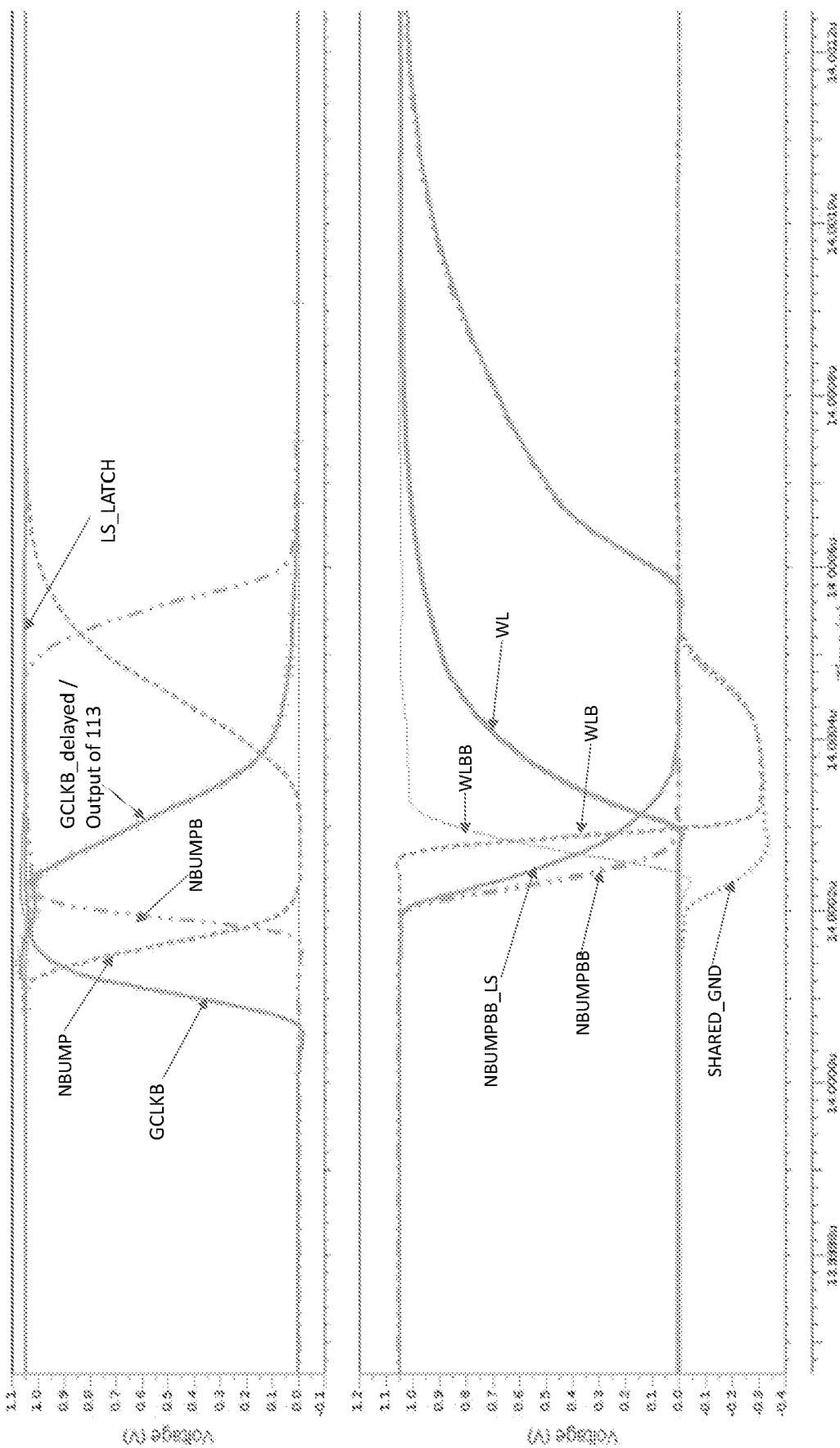
FIG. 7 is a graph showing the word line and control signal voltages of the memory architecture of FIG. 2 in operation.

In operation, the predecoded address Predecoded_Addr activates a given decoder 102 (here, decoder 102a as an example) indicating that the word line WL associated with that decoder 102 is to be driven high upon the address clock Address_Clk rising high. Therefore, upon the address clock Address_Clk being driven high, the decoder logic 104 drives the word line WLBB high, turning off the transistor T1 and turning on the transistor T2, with the result being that the inverse word line signal WLB is pulled to the voltage −Ve (which is below ground). Therefore, the gate to source voltage Vgs of the p-channel transistor T3 will have a greater negative magnitude than Vgs would have if the source of the transistor T2 had been tied to ground instead of −Ve (Vgs is more negative than it would have been if T2 had been tied to ground). This effectively reduces the threshold voltage Vt of the transistor T3, boosts (reduces) the slope of the voltage of the word line WL over what it would otherwise have been had the source of the transistor T2 been tied to ground instead of −Ve, helps for the early transition of the inverse word line signal WLB from high to low, and contributes to a faster rise of the word line signal WL, as can be seen in the graph of FIG. 7.

Figure 3:
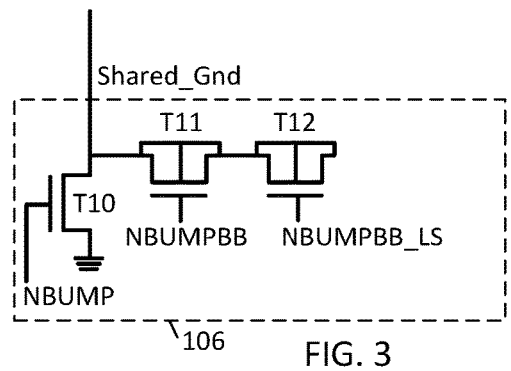
FIG. 3 is a schematic diagram of the negative bias circuitry of FIG. 2.

Refer now to FIG. 3, showing the negative bias circuitry 106 in detail. The negative bias circuitry 106 includes an n-channel transistor T10 having its drain connected to the drain of the n-channel transistor T2, its source connected to ground, and its gate connected to the negative bump enable signal NBUMP. An n-channel transistor T11 has its drain connected to the drain of the n-channel transistor T10, its source connected to a drain of n-channel transistor T12, its gate connected to a negative bump enable signal NBUMPBB, and has its source, drain, and bulk shorted so that it acts as a capacitor. An n-channel transistor T12 has its drain connected to the drain of the n-channel transistor T10, its gate connected to a low speed enable negative bump signal NBUMPBB_LS, and has its source, drain, and bulk shorted so that it acts as a capacitor. Note that in some instances, transistor T12 may not be present. In addition, instead of transistors T11 and/or T12 being present and used as capacitors, discrete capacitors may be used.

When a given row decoder 102 (here, row decoder 102a) is not selected by the predecoded address Predecoded_Addr, the word line signal WLBB is driven low, turning on transistor T1 such that the inverse word line signal WLB is driven high, in turn turning on transistor T4 and causing the word line WL to be output as low.

Together with this operation, the negative bump enable signal NBUMP is driven high to turn on the n-channel transistor T10, pulling the shared ground node Shared_Gnd to actual ground (zero volts). Since transistors T11 and T12 are configured as capacitors, with their bulks (substrates) as tied to their drains and sources acting as one plate and their gates acting as their other plate, when the delayed negative bump enable signal NBUMPBB and the low speed enable negative bump signal NBUMPBB_LS (assuming the low speed latch signal LS_LATCH is high) rise high after the negative bump enable signal NBUMP signal rises high, the transistors T11 and T12 (acting as capacitors) are charged to NBUMPBB and NBUMPBB_LS respectively due to these positive voltages at their bottom plates (their gates), and due to ground at their top plates (their bulks).

Now, when that given row decoder 102 (here, row decoder 102a) is subsequently selected by the predecoded address Predecoded_Addr, the word line voltage WLBB rises high, and the negative bump enable signal NBUMP is pulled to ground, turning off transistor T10, and causing NBUMPBB and NBUMPBB_LS to be pulled to ground. NBUMPBB and NBUMPBB_LS being pulled to ground results negative voltages appearing at the top plates of the capacitor transistors T11 and T12, and these voltages add to form the negative voltage −Ve, which is applied to the source of the n-channel transistor T2 at the shared ground node Shared_Gnd, thereby causing the transistor T2 (turned on by WLBB) to pull WLB to a −Ve. As explained, this effectively reduces the threshold voltage Vt of the transistor T3, and improves (reduces the slope) of the voltage of the word line WL over what it otherwise would have been had the source of the transistor T2 been tied to ground instead of −Ve.

This operation can be seen in FIG. 7, where WLBB starts off low (meaning that the row decoder 102a has not yet been selected), and accordingly NBUMPBB and NBUMPBB_LS start off high. At about 14.0002 μs, the row decoder 102a is selected, and the word line WLBB begins to rise. At the same time, NBUMP is released to turn off transistor T10, and NBUMPBB and NBUMPBB_LS fall, causing the voltage at the shared ground node Shared_Gnd to fall to a negative value −Ve that is in turn applied to the source of the n-channel transistor T2, as explained above.

It should be appreciated that in some instances where the transistor T12 is present, NBUMPBB_LS may not be driven high (by setting LS_LATCH to zero), provided that the magnitude of the negative voltage generate at the shared ground node is sufficient to yield the desired reduction in the slope of the voltage of the word line WL.

Figure 4:
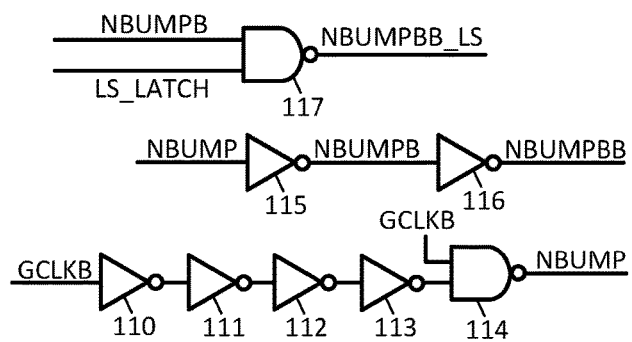
FIG. 4 is a schematic diagram of logic circuitry generating the various control signals used by the memory architecture of FIG. 2.

The generation of the negative bump enable signal NBUMP, inverse negative bump enable signal NBUMPB, negative bump enable signal NBUMPBB, and low speed enable negative bump signal NBUMPBB_LS is shown in FIG. 4. Here, it can be observed that the inverse of a global clock GCLKB is delayed by four inverters 110-114, and then logically NANDed by NAND gate 114 with the non-delayed inverse of a global clock GCLKB to produce the negative bump enable signal NBUMP. The inverse negative bump enable signal NBUMPB is produced by passing the negative bump enable signal NBUMP through an inverter 115, and the delayed negative bump enable signal is produced by passing the inverse negative bump enable signal NBUMPB through another inverter 116. The low speed enable negative bump signal NBUMPBB_LS is produced by logically NANDing the inverse negative bump enable NBUMPB signal with a low speed latch signal LS_LATCH (which may be received from control circuitry, not shown) using NAND gate 117.

Figure 5:
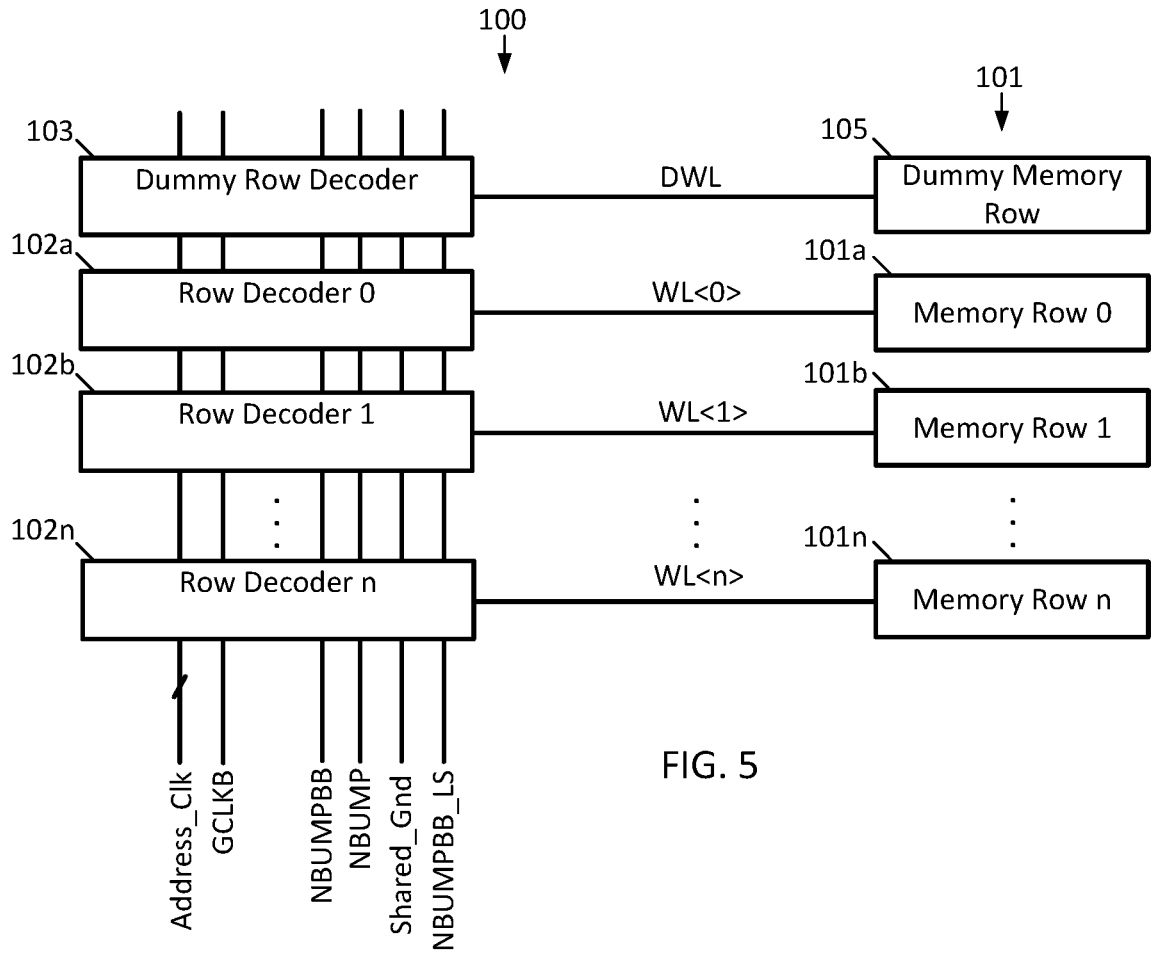
FIG. 5 is a block diagram showing a memory array utilizing the memory architecture of FIG. 2.

Shown in FIG. 5 is a block diagram illustrating the memory architecture 100 illustrating that the memory 101 may include a dummy row 105, and that in addition to n row decoders 102a, . . . , 102n each paired to a corresponding memory row 101a, . . . , 101n, there may be a dummy row decoder 103 paired to the dummy row 105. The dummy row decoder 103 and dummy memory row 105 may be used for determining timing for read and write operations.

Of note here is that the address clock Address_Clk, inverse of a global clock GCLKB, negative bump enable signal NBUMP, negative bump enable signal NBUMPBB, low speed enable negative bump signal NBUMPBB_LS, and shared ground Shared_Gnd lines are run globally to all row decoders.

Figure 6:
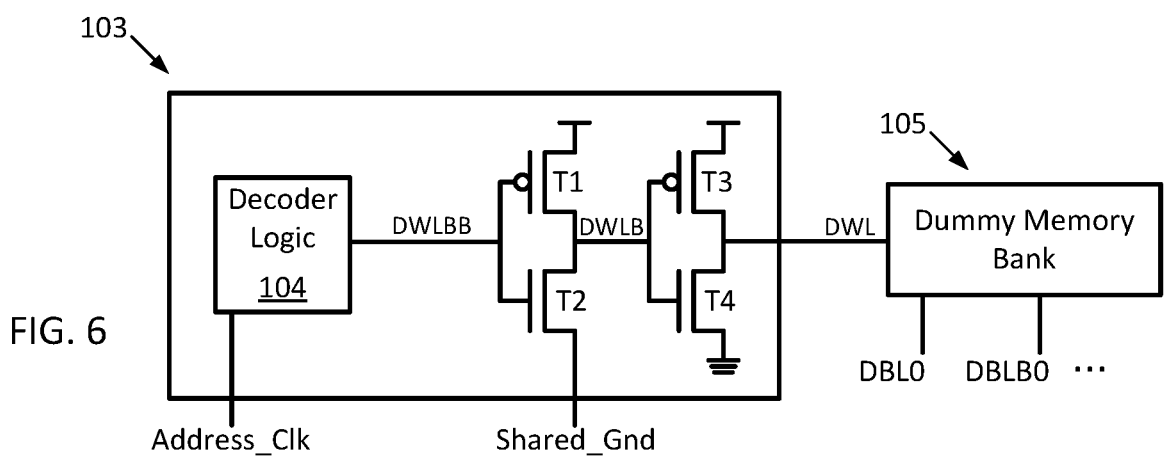
FIG. 6 is a schematic block diagram showing the dummy row decoder and dummy memory row of FIG. 5.

The dummy row decoder 103 and dummy memory row 105 are shown in greater detail in FIG. 6, where it can be seen that the dummy row decoder 103 has the same structure and operation as the row decoders 102, with the decoder logic 104 receiving the address clock Address_Clk and outputting the dummy word line signal DWLBB, which is inverted by the inverter formed by transistors T1 and T2 to produce the inverse dummy word line signal DWLB, which in turn is inverted by the inverter formed by transistors T3 and T4 to produce the word line signal DWL for output to the dummy memory row 105. As with the row decoders 102, transistor T2 in the dummy row decoder 102 has its source connected to the shared ground node Shared_Gnd to receive the negative voltage −Ve, as described above.

When the memory architecture 100 is implemented in 40 nm CMOS, the speed gains were found to be approximately 10%, with negligible increases in area and dynamic power consumption. This speed gain is highly dependent on the technology in which the memory architecture 100 is formed, as well as the architecture of the SRAM used within the memory architecture. Indeed, in cases where the memory architecture 100 is formed in other technologies, the speed gain may be even higher.

Note that the techniques and circuitry provided above may be applied to precharge signal drivers as well as to write drivers, and need not be limited to word line drivers.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. Decoder circuitry for a memory, comprising:
a row decoder comprising:
decoder logic configured to generate an initial word line signal;
a first inverter comprising:
a first p-channel transistor having a source coupled to a supply voltage, a drain, and a gate coupled to the decoder logic to receive the initial word line signal; and
a first n-channel transistor having a drain coupled to the drain of the first p-channel transistor, a source coupled to a shared ground line, and a gate coupled to the decoder logic to receive the initial word line signal;
wherein an inverse word line signal is generated at the drains of the first p-channel transistor and the first n-channel transistor;
a second inverter configured to invert the inverse word line signal to produce a word line signal; and
negative bias generation circuitry configured to generate a negative bias voltage on the shared ground line when the initial word line signal is at a logic high, and to couple the shared ground line to ground when the initial word line signal is at a logic low;
wherein the negative bias generation circuitry comprises:
an n-channel transistor having a drain coupled to the shared ground line, a source coupled to ground, and a gate biased by a negative bump enable signal; and
a first capacitor having a first terminal coupled to the drain of the n-channel transistor and a second terminal coupled to a first delayed negative bump enable signal, the first delayed negative bump enable signal being a delayed version of the negative bump enable signal.

2. The decoder circuitry of claim 1, wherein the negative bias generation circuitry further comprises a second capacitor having a first terminal coupled to the drain of the n-channel transistor and a second terminal coupled to a second delayed negative bump enable signal.

3. The decoder circuitry of claim 2, wherein the second delayed negative bump enable signal is generated by performing a logical NAND operation on an inverse of the negative bump enable signal and a low speed latch.

4. The decoder circuitry of claim 1 wherein the negative bump enable signal is generated by delaying an inverse of a global clock signal, and performing a logical NAND operation between the delayed inverse global clock signal and the inverse global clock signal.

5. The decoder circuitry of claim 1, wherein the row decoder and negative bias generation circuitry are formed in fully depleted silicon on insulator technology.

6. An electronic device, comprising:
a plurality of row decoders, each row decoder comprising:
decoder logic configured to generate an initial word line signal for that row decoder;
a first inverter comprising:
a first p-channel transistor having a source coupled to a supply voltage, a drain, and a gate coupled to the decoder logic to receive the initial word line signal for that row decoder; and
a first n-channel transistor having a drain coupled to the drain of the first p-channel transistor, a source coupled to a shared ground line, and a gate coupled to the decoder logic to receive the initial word line signal for that row decoder, wherein the shared ground line is common to each of the plurality of row decoders;
wherein an inverse word line signal for that row decoder is generated at the drains of the first p-channel transistor and the first n-channel transistor;
a second inverter configured to invert the inverse word line signal to produce a word line signal for that row decoder; and
negative bias generation circuitry configured to generate a negative bias voltage on the shared ground line when the initial word line signal is at a logic high;
wherein the negative bias generation circuitry comprises:
an n-channel transistor having a drain coupled to the shared ground line, a source coupled to ground, and a gate biased by a negative bump enable signal; and
a first capacitor having a first terminal coupled to the drain of the n-channel transistor and a second terminal coupled to a first delayed negative bump enable signal, the first delayed negative bump enable signal being a delayed version of the negative bump enable signal.

7. The electronic device of claim 6, wherein the negative bias generation circuitry further comprises a second capacitor having a first terminal coupled to the drain of the n-channel transistor and a second terminal coupled to a second delayed negative bump enable signal.

8. The electronic device of claim 6, wherein the second delayed negative bump enable signal is generated by performing a logical NAND operation on an inverse of the negative bump enable signal and a low speed latch.

9. The electronic device of claim 6, wherein the negative bump enable signal is generated by delaying an inverse of a global clock signal, and performing a logical NAND operation between the delayed inverse global clock signal and the inverse global clock signal.

10. The electronic device of claim 6, wherein the plurality of row decoders and negative bias generation circuitry are formed in fully depleted silicon on insulator technology.

11. The electronic device of claim 6, further comprising a SRAM memory having a plurality of rows, each of the plurality of rows being associated with a given one of the plurality of row decoders.

12. Decoder circuitry for a memory, comprising:
a row decoder comprising:
decoder logic configured to generate an initial word line signal; and
a first inverter powered between a supply voltage and a shared ground line, having an input coupled to the decoder logic to receive an initial word line signal, and having an output generating an inverse word line signal; and
negative bias generation circuitry configured to generate a negative bias voltage on the shared ground line when the initial word line signal is at a logic high, and to couple the shared ground line to ground when the initial word line signal is at a logic low;
wherein the negative bias generation circuitry comprises:
an n-channel transistor having a drain coupled to the shared ground line, a source coupled to ground, and a gate biased by a negative bump enable signal; and
a first capacitor having a first terminal coupled to the drain of the n-channel transistor and a second terminal coupled to a first delayed negative bump enable signal, the first delayed negative bump enable signal being a delayed version of the negative bump enable signal.

13. The decoder circuitry of claim 12, wherein the negative bias generation circuitry further comprises a second capacitor having a first terminal coupled to the drain of the n-channel transistor and a second terminal coupled to a second delayed negative bump enable signal.

14. The decoder circuitry of claim 13, wherein the second delayed negative bump enable signal is generated by performing a logical NAND operation on an inverse of the negative bump enable signal and a low speed enable signal.

15. The decoder circuitry of claim 12, wherein the negative bump enable signal is generated by delaying an inverse of a global clock signal, and performing a logical NAND operation between the delayed inverse global clock signal and the inverse global clock signal.

16. A method of operating a row decoder for a memory, the row decoder including decoder logic that generates an initial word line signal, and a first inverter powered between a supply voltage and a shared ground line, the first inverter having an input coupled to the decoder logic to receive an initial word line signal and having an output generating an inverse word line signal, the method comprising:
generating a negative bias voltage on the shared ground line when the initial word line signal is at a logic high by connecting a second terminal of a capacitor to a positive value when the initial word line signal is at a logic low and connecting a first terminal of the capacitor to the shared ground line when the initial word line signal is at a logic high;
coupling the shared ground line to ground when the initial word line signal is at a logic low.

17. A memory unit, comprising:
a memory array coupled to a word line signal; and
a row decoder for the memory array, the row decoder comprising:
a first inverter powered between a supply voltage and a shared ground line, the first inverter having an input configured to receive an initial word line signal and having an output generating an inverse word line signal; and
a second inverter powered between the supply voltage and ground, the second inverter having an input configured to receive the inverse word line signal and having an output generating the word line signal;
wherein the shared ground line is configured to receive a negative bias voltage when the initial word line signal is at a first logic level, and to receive a ground voltage when the initial word line signal is at a second logic level different than the first logic;
negative bias generation circuitry configured to generate the negative bias voltage on the shared ground line when the initial word line signal is at the first logic level, and to couple the shared ground line to ground when the initial word line signal is at the second logic level;
wherein the negative bias generation circuitry comprises:
a first transistor having a first conduction terminal coupled to the shared ground line, a second conduction terminal coupled to ground, and a gate biased by a negative bump enable signal;
a first capacitor having a first terminal coupled to the first conduction terminal of the first transistor and a second terminal coupled to a first delayed negative bump enable signal, the first delayed negative bump enable signal being a delayed version of the negative bump enable signal; and
a second capacitor having a first terminal coupled to the first conduction terminal of the first transistor and a second terminal coupled to a second delayed negative bump enable signal.

18. The memory unit of claim 17, wherein the negative bump enable signal is generated by delaying an inverse of a global clock signal, and performing a logical NAND operation between the delayed inverse global clock signal and the inverse global clock signal.

19. Decoder circuitry for a memory, comprising:
a row decoder comprising:
decoder logic configured to generate an initial word line signal;
a word line drive circuit powered between a supply voltage and a shared ground line and configured to receive the initial word line signal and generate a word line signal; and
negative bias generation circuitry configured to generate a negative bias voltage on the shared ground line when the initial word line signal is at a logic high, and to couple the shared ground line to ground when the initial word line signal is at a logic low;
wherein the negative bias generation circuitry comprises a transistor and a capacitor wherein the transistor is controlled by a negative bump enable signal and the capacitor has a first terminal coupled to the transistor and a second terminal configured to receive a delayed version of the negative bump enable signal.

20. The decoder circuitry of claim 19, wherein the row decoder and negative bias generation circuitry are formed in fully depleted silicon on insulator technology.

21. The decoder circuitry of claim 19, wherein the negative bias generation circuitry further comprises a further capacitor having a first terminal coupled to the transistor and a second terminal configured to receive a further delayed version of the negative bump enable signal.

* * * * *